United States Patent [19]

Seyyedy

[11] Patent Number: 5,638,318
[45] Date of Patent: Jun. 10, 1997

[54] FERROELECTRIC MEMORY USING FERROELECTRIC REFERENCE CELLS

[75] Inventor: Mirmajid Seyyedy, Boise, Id.

[73] Assignee: Micron Technology, Inc., Boise, Id.

[21] Appl. No.: 520,256

[22] Filed: Sep. 11, 1995

[51] Int. Cl.$^6$ ............................................. G11C 11/22
[52] U.S. Cl. ........................................ 365/145; 365/210
[58] Field of Search .................................. 365/145, 149, 365/210

[56] References Cited

U.S. PATENT DOCUMENTS

| 4,809,225 | 2/1989 | Dimmler et al. | 365/145 |
| 4,873,664 | 10/1989 | Eaton, Jr. | 365/145 |
| 4,888,733 | 12/1989 | Mobley | 365/145 |
| 5,010,518 | 4/1991 | Toda | 365/145 |
| 5,086,412 | 2/1992 | Jaffe et al. | 365/145 |
| 5,218,566 | 6/1993 | Papaliolios | 365/145 |
| 5,254,482 | 10/1993 | Fisch | 437/8 |
| 5,297,077 | 3/1994 | Imai et al. | 365/145 |
| 5,305,273 | 4/1994 | Jinbo | 365/210 |
| 5,424,975 | 6/1995 | Lowrey et al. | 365/145 |
| 5,432,731 | 7/1995 | Kirsch et al. | 365/145 |
| 5,487,029 | 1/1996 | Kuroda | 365/145 |

FOREIGN PATENT DOCUMENTS

| 364813 | 10/1989 | European Pat. Off. . |
| 3-5996 | 1/1991 | Japan . |

OTHER PUBLICATIONS

Wayne Kinney et al., "Memory Applications of Integrated Ferroelectric Technology," *Digest of Technical Papers*, 266–267 (1994).

Reza Moazzami et al., "A Ferroelectric Dram Cell for High Density Nvrams," *1990 Symposium on VLSI Technology*, 15–17 (1990).

Tatsumi Sumi et al., "A 256kb Nonvolatile Ferroelectric Memory at 3V and 100ns," *Digest of Technical Papers*, 268–269 (1994).

Primary Examiner—Joseph A. Popek
Attorney, Agent, or Firm—Schwegman, Lundberg, Woessner & Kluth, P.A.

[57] ABSTRACT

A random access memory circuit is described which uses single ferroelectric memory cells to store data. The ferroelectric memory cells can be selectively read using reference cells to generate a reference voltage which is compared to a voltage representative of data stored on the memory cell using a multiplexed sense amplifier. In using two ferroelectric reference cells in which one contains a logical 0 polarization, and the other contains a logical 1 polarization, a single-ended reference voltage can be generated on a reference bit line. A ferroelectric memory cell can then be read by comparing the voltage on its corresponding bit line to the reference bit line using the sense amplifier. The content of the memory cell being read and the content of the reference cells can be rewritten on the same clock cycles to save on access time.

12 Claims, 10 Drawing Sheets

FERROELECTRIC MEMORY USING FERROELECTRIC REFERENCE CELLS

This invention was made with government support under Contract No. MDA972-94-C-0006 awarded by Advanced Research Projects Agency (ARPA). The Government has certain rights in this invention.

TECHNICAL FIELD OF THE INVENTION

The present invention relates generally to ferroelectric memories and in particular the present invention relates to a circuit which produces a reference voltage used to read the memory.

BACKGROUND OF THE INVENTION

Placing ferroelectric material between the plates of a capacitor on a semiconductor substrate causes the capacitor to exhibit a memory effect in the form of charge polarization between the plates of the capacitor. In effect, when the capacitor is charged with the field lines running in one direction across the capacitor plates, a residual charge polarization remains after the charge is removed from the capacitor plates. If an opposite charge is placed on the capacitor plates, an opposite residual polarization remains. A plot of the applied field voltage (E) across the plates of the capacitor against the polarization (P) of the ferroelectric material between the plates of the capacitor exhibits a classic hysteresis curve as shown in FIG. 1. This type of hysteresis response of ferroelectric material between the plates of the capacitor manufactured on a semiconductor die as known in the art and is described in U.S. Pat. No. 4,873,664 to Eaton Jr., which is incorporated herein by reference.

Using ferroelectric material in the manufacture of capacitors for use in the cells of memory arrays is also known in the art. By applying a coercive voltage across the plates of the ferroelectric capacitor to produce one polarization or another, the residual polarization stores a nonvolatile 1 or 0 in the cell. If a ferroelectric capacitor has zero volts applied across its plates, it may be polarized as indicated by either point A or point D in FIG. 1. Assuming that the polarization is at point A, if a positive voltage is applied across the capacitor which is greater than the "coercive voltage" indicated by line B, then the capacitor will conduct current and move to a new polarization at point C. When the voltage across the capacitor returns to zero, the polarization will remain the same and move to point D. If a positive voltage is applied across the capacitor when it is polarized at point D, the capacitor will not conduct current, but will move to point C. It can be seen that a negative potential can be used to change the polarization of a capacitor from point D to point A. Therefore, points A and D can represent two logic states occurring when zero volts are applied to the capacitor and which depend upon the history of voltage applied to the capacitor.

The reading of the polarization of the ferroelectric capacitor can be a destructive read in which a pulse is applied to the ferroelectric capacitor and the amount of resultant charge is either low if the pulse polarity agreed with the previous memorization polarity, or the resultant charge is higher if the charge polarity placed on the capacitor is of the opposite polarity last placed across the plates of the capacitor. This minute difference between an agreeable charge and an opposite charge can be measured to determine what the previous polarization on the ferroelectric capacitor was as it was last written. If a large charge results from reading a memory cell, the memory cell polarization will move from one state to the other state, for example point A to Point D. Thus, the data read from the memory cell must be restored.

The fact that the ferroelectric capacitors require a destructive read to determine the last polarization, and the fact that the resultant charge differences of the ferroelectric capacitor between an agreeable applied pulse and an opposite applied pulse make the technique of reading and writing ferroelectric memories a difficult task. The benefit of having a nonvolatile memory in which stored data remains without any battery backup or other external application of power is of great use in the computer and control industries. However, for any such nonvolatile memories to be of any use, the memories must be of a high enough density and must have a fast enough response time to make them commercially more attractive than battery backed up DRAM, mechanical disk storage and other types of nonvolatile storage.

One of the shortcomings of the prior art is the fact that the ferroelectric capacitors age through use, producing distinctly nonlinear hysteresis curves such as that shown in FIG. 2. Thus, it becomes increasingly difficult to determine the correct polarization of the cells as they age. For example, if a memory cell fabricated as a ferroelectric capacitor is polarized at point A in FIG. 2, a positive voltage greater than the coercive voltage B will move the polarization of the cell to point C. When moving from point A to point C the capacitor will conduct current. When reading a memory cell having polarity of point D using a positive voltage, however, a current is also conducted as the polarity moves to point C. The differences between the resultant currents of the two different states of the capacitor, therefore, becomes smaller as the capacitor ages. It will be appreciated that reading a memory cell having a hysteresis curve of FIG. 2 will be more difficult than reading a memory cell having an ideal hysteresis curve of FIG. 1.

Another shortcoming of the prior art is the inability to produce high density ferroelectric memories having high operating speeds comparable to that of DRAM storage devices. Along these lines, the aforementioned Eaton Jr. patent describes the application of ferroelectric capacitors to high density memory storage, as shown in FIG. 3. In this arrangement, each memory storage cell comprises a pair of ferroelectric capacitors and a pair of access transistor. One plate of the pair of ferroelectric capacitors is connected to a plate line, while the other plates of the ferroelectric capacitor are connected through access transistors to separate bit lines. In operation, a momentary voltage pulse is placed on the ferroelectric capacitors between the bit lines and the plate line to polarize the ferroelectric material of the two ferroelectric capacitors, resulting in a polarization of one direction for one capacitor and an opposite polarization for the second ferroelectric capacitor.

Eaton Jr. takes this concept a step further by using a regular array of ferroelectric capacitors, whereby each cell contains two ferroelectric capacitors and two access transistors. The ferroelectric capacitors within each memory cell receives complementary input signals such that the ferroelectric capacitors are polarized in opposite states to indicate a 1 or a 0. When the pairs of capacitors for each cell are read, a resulting voltage on the bit lines, which result from applying a pulse on a plate line, is compared using a differential sense amplifier to compare the voltages on the bit lines and thus determine the polarity on the ferroelectric capacitors within the cell.

The disadvantage of the above approach is that Eaton Jr. requires that each cell contain at least two transistors and two ferroelectric capacitors. This approach takes up a large area of the chip for implementation, which limits the overall density of a memory array.

An improvement on the Eaton Jr. et al. approach is found in U.S. patent application Ser. No. 08/175,923 entitled "REFERENCE CIRCUIT FOR A NONVOLATILE FERROELECTRIC MEMORY" to Lowry et al. This patent application is assigned to the same assignee as the present patent application. It is not prior art. This improvement for ferroelectric memory designs from Lowry et al. describes an array of memory cells in which each cell comprises a single ferroelectric capacitor and a single access transistor. The cells are arranged in a regular array such that common word lines and common plate lines are used to access rows of ferroelectric capacitor cells. The Lowry et al. patent application describes a folded bit line architecture in which bit lines for adjacent columns have staggered cells, such that a word line (WL) from one, row does not activate memory cells 80 on adjacent bit lines, as seen in FIG. 4. It will be appreciated that the plate lines PL0 and PL1 can be combined as one common plate. In the Lowry et al. patent application, the result is an active bit line (BL) for one column, and an inactive bit line for an adjacent column when the word line and plate lines are activated for reading or writing a particular ferroelectric memory cell. With an adjacent inactive bit line, the unused bit line is available for attachment to a single-ended reference circuit 90 using a reference decoder 92. The single-ended reference circuit of Lowry et al. allows for placing a highly accurate voltage on the adjacent unused bit line, which can be used by the sense amplifier 94 to compare to any active bit line to determine the state of the ferroelectric capacitor, when the plate line is pulsed. U.S. patent application Ser. No. 08/175,923 to Lowry et al. is hereby incorporated by reference.

Still lacking in the industry is a ferroelectric memory cell array using a RAM architecture which uses ferroelectric reference cells to produce a reference voltage for reading the ferroelectric memory cells.

SUMMARY OF THE INVENTION

The present invention solves the aforementioned problems in the industry, and other problems, which will be appreciated by those skilled in the art upon reading and traderstanding the following specification. The present invention describes a circuit and method of implementing a ferroelectric memory cell in a regular array and use of reference cells to generate a reference voltage which is compared to the memory cell using a multiplexed sense amplifier. In using two ferroelectric reference cells in which one contains a logical 0 polarization, and the other contains a logical 1 polarization, a single-ended reference voltage can be generated on a reference bit line. A cell can then be read by comparing the voltage on its corresponding bit line to the reference bit line using the sense amplifier. The content of a the cell being read and the reference cells can be rewritten on the same clock cycles to save on access time.

In particular, the present invention describes an integrated circuit memory comprising an array of ferroelectric memory cells, a sense amplifier to sense and amplify data stored on the ferroelectric memory cells, a bit line for coupling the ferroelectric memory cells to the sense amplifier, and reference circuitry coupled to the sense amplifier and having a plurality of ferroelectric reference cells for providing a reference voltage. The plurality of ferroelectric reference cells can be an even number, and a first one-half of the plurality of ferroelectric reference cells are polarized in one state and a second one-half of the plurality of ferroelectric reference cells are polarized in an opposite state.

In another embodiment, the first one-half of the plurality of ferroelectric reference cells are coupled to a first reference bit line, the second one-half of the plurality of ferroelectric reference cells are coupled to a second reference bit line, and the reference circuitry includes an equilibrate circuit connected to the first reference bit line and the second reference bit line for electrically coupling the first reference bit line to the second reference bit line. Further, the equilibrate circuit can comprise an n-channel transistor having a source connected to the first reference bit line and a drain connected to the second reference bit line. Isolation circuitry can be provided for selectively coupling either the first reference bit line or the second reference bit line to the sense amplifier.

In yet another embodiment, a method of generating a reference voltage in a ferroelectric memory circuit is described. The method comprises the steps of coupling a first ferroelectric reference cell to a first reference bit line, the first ferroelectric reference cell storing a first logic state, reading the first ferroelectric reference cell such that a voltage is imparted on the first reference bit line representative of the first logic state, and coupling a second ferroelectric reference cell to a second reference bit line, the second ferroelectric reference cell storing a second logic state. The method also includes the steps of reading the second ferroelectric reference cell such that a voltage is imparted on the second reference bit line representative of the second logic state, and electrically coupling the first reference bit line to the second reference bit line to produce the reference voltage.

In still another embodiment, a method of reading a ferroelectric memory comprising a plurality of ferroelectric memory cells, and a sense amplifier is described. The method comprises the steps of selectively coupling one of the ferroelectric memory cells to a bit line, providing a voltage to a plate of the one of the ferroelectric memory cells such that a voltage is imparted on the bit line representative of data stored on the one of the ferroelectric memory cells, coupling the bit line to the sense amplifier, producing a reference voltage using a plurality of ferroelectric reference cells, and electrically coupling the reference voltage to the sense amplifier. The step of producing the reference voltage can comprise the steps of coupling a first ferroelectric reference cell to a first reference bit line, the first ferroelectric reference cell storing a first logic state, coupling a second ferroelectric reference cell to a second reference bit line, the second ferroelectric reference cell storing a second logic state, reading the first and second ferroelectric reference cells, and electrically coupling the first and second reference bit lines together. Additionally, another embodiment can include the steps of restoring the first ferroelectric reference cell to a first logic state, and restoring the second ferroelectric reference cell storing a second logic state. Finally, in another embodiment, the method can include the steps of restoring the one of the ferroelectric memory cells on a first clock cycle, and restoring the first and second reference cells on the first clock cycle.

BRIEF DESCRIPTION OF THE DRAWINGS

In the drawings, where like numerals refer to like components throughout the several views.

DETAILED DESCRIPTION OF THE PREFERRED EMBODIMENT

In the following detailed description of the preferred embodiments, reference is made to the accompanying drawings which font, a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 5:
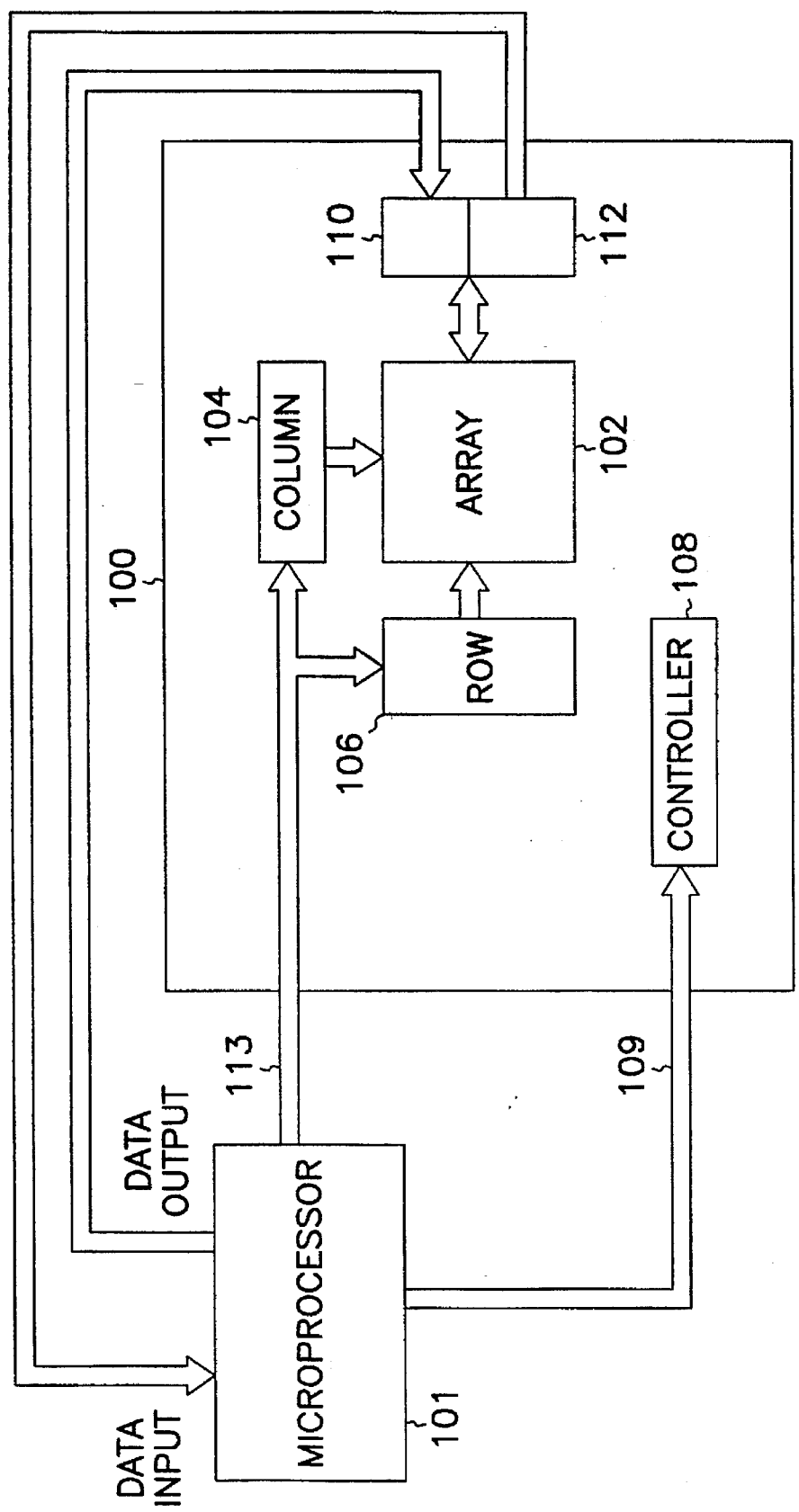
FIG. 5 is a block diagram of a memory incorporating the present invention.

FIG. 5 shows a general block diagram of a memory circuit 100 incorporating the present invention. The memory circuit is coupled to a microprocessor 101 and includes a memory array 102, column 104 and row 106 decoders, and a control circuit 108. The memory circuit also includes input 110 and output 112 buffers connected to data input and data output lines, respectively. The data input and output lines can be multiplexed together, but have been illustrated separately for simplicity. Address lines 113 are provided as input to the row and column decoders to address a portion of the memory array.

In operation, the memory circuit control 108 responds to control inputs 109 from the microprocessor to perform different operations on the memory array. In particular, the control circuit is used to read data from and write data to the memory array 102. During one of these access operations, an address provided on the address lines 113 is decoded by the row decoder 106 to access one row of the memory array. Likewise, input provided on the address lines is decoded by the column decoder 104 to access at least one column of the memory array. During a read operation, the data stored in the addressed memory cell(s) is then transferred to the output buffer 112 and provided on the data output lines. In a write operation, the addressed memory cell is accessed and data provided on the data input lines is stored in the cell.

Figure 1:
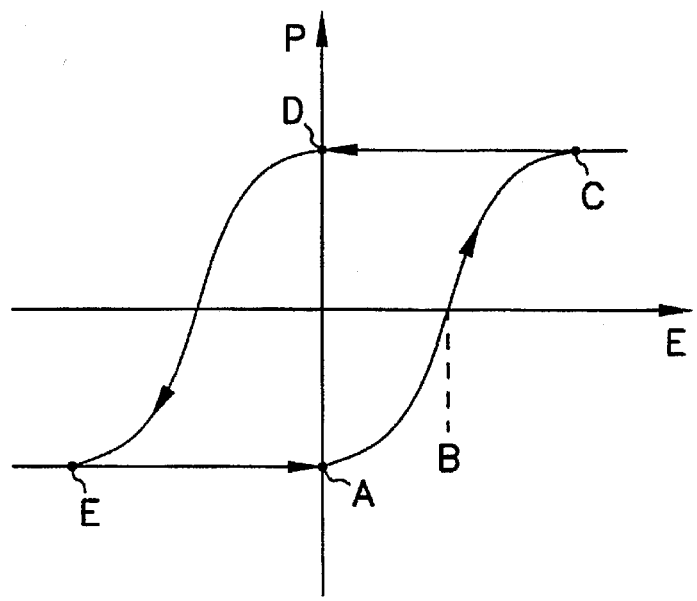
FIG. 1 is a hysteresis curve of a ferroelectric capacitor.
Figure 2:
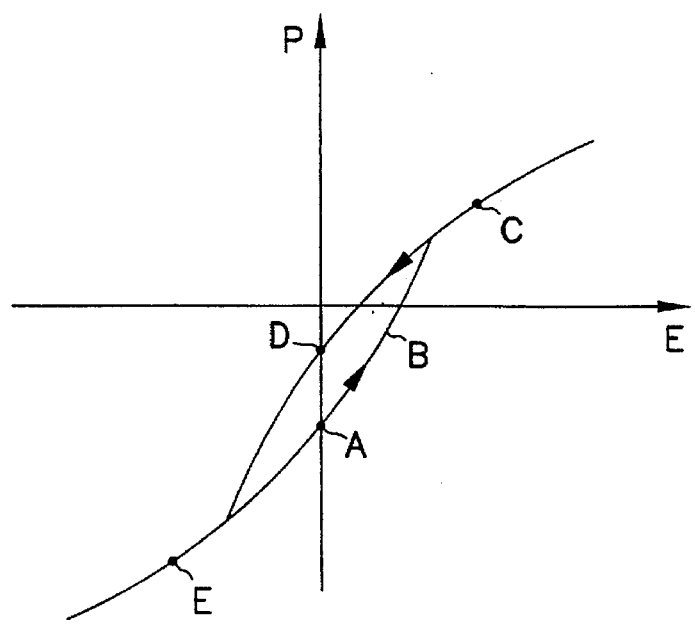
FIG. 2 is a hysteresis curve of an aged ferroelectric capacitor.
Figure 3:
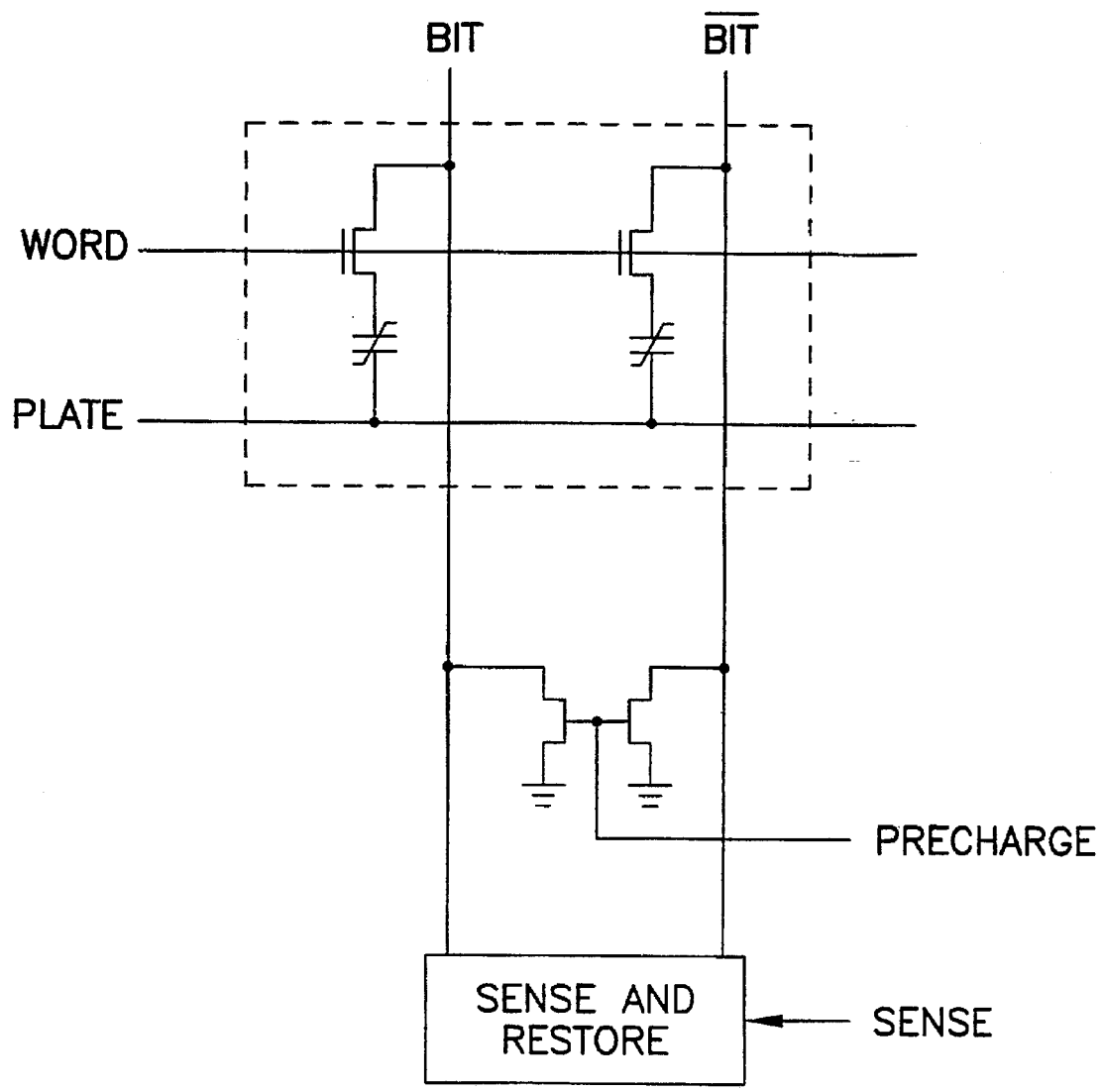
FIG. 3 is a ferroelectric memory having two capacitors per memory cell.
Figure 4:
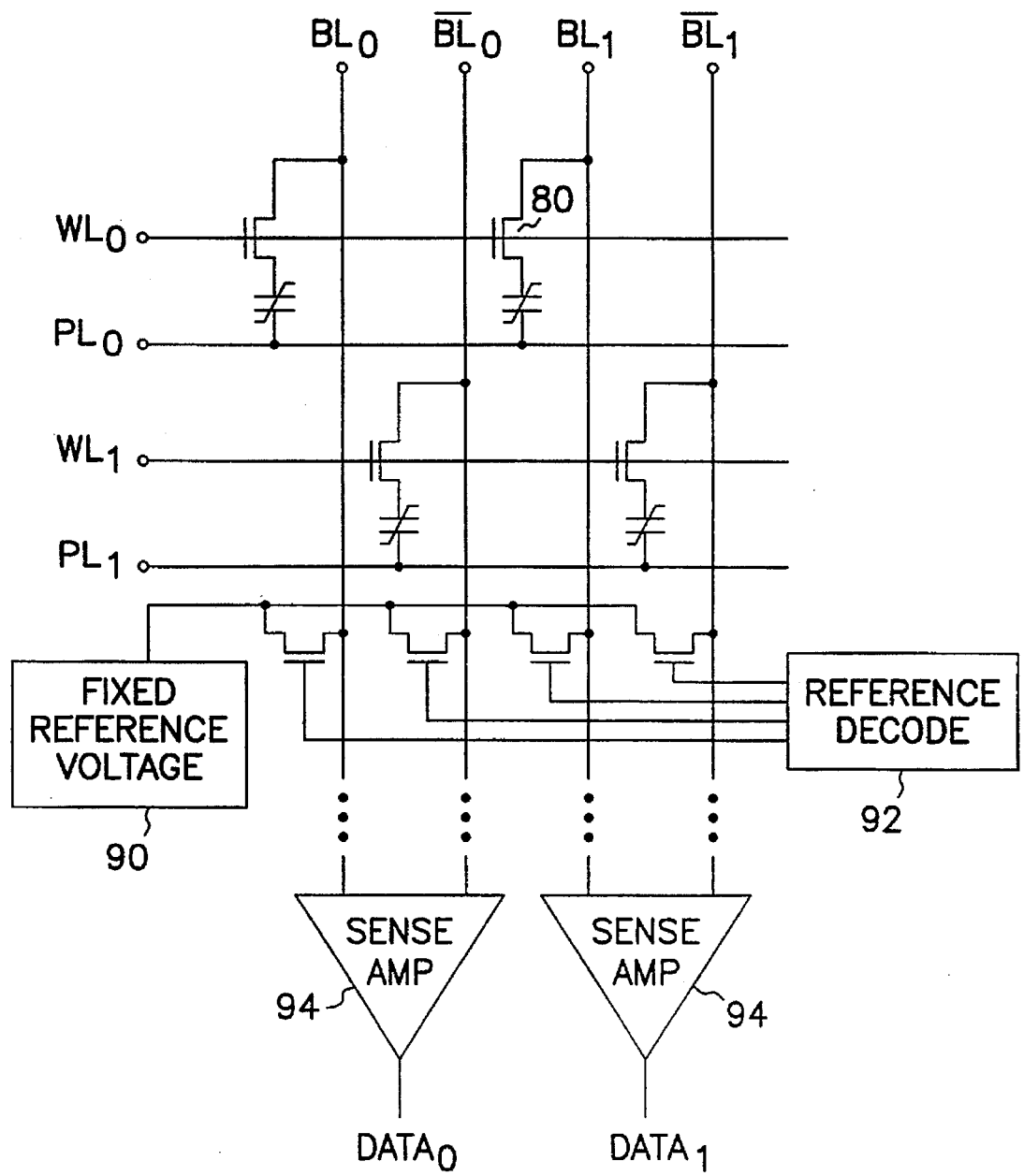
FIG. 4 is a portion of a ferroelectric memory array having a folded bit line architecture and single-ended reference circuit.
Figure 6:
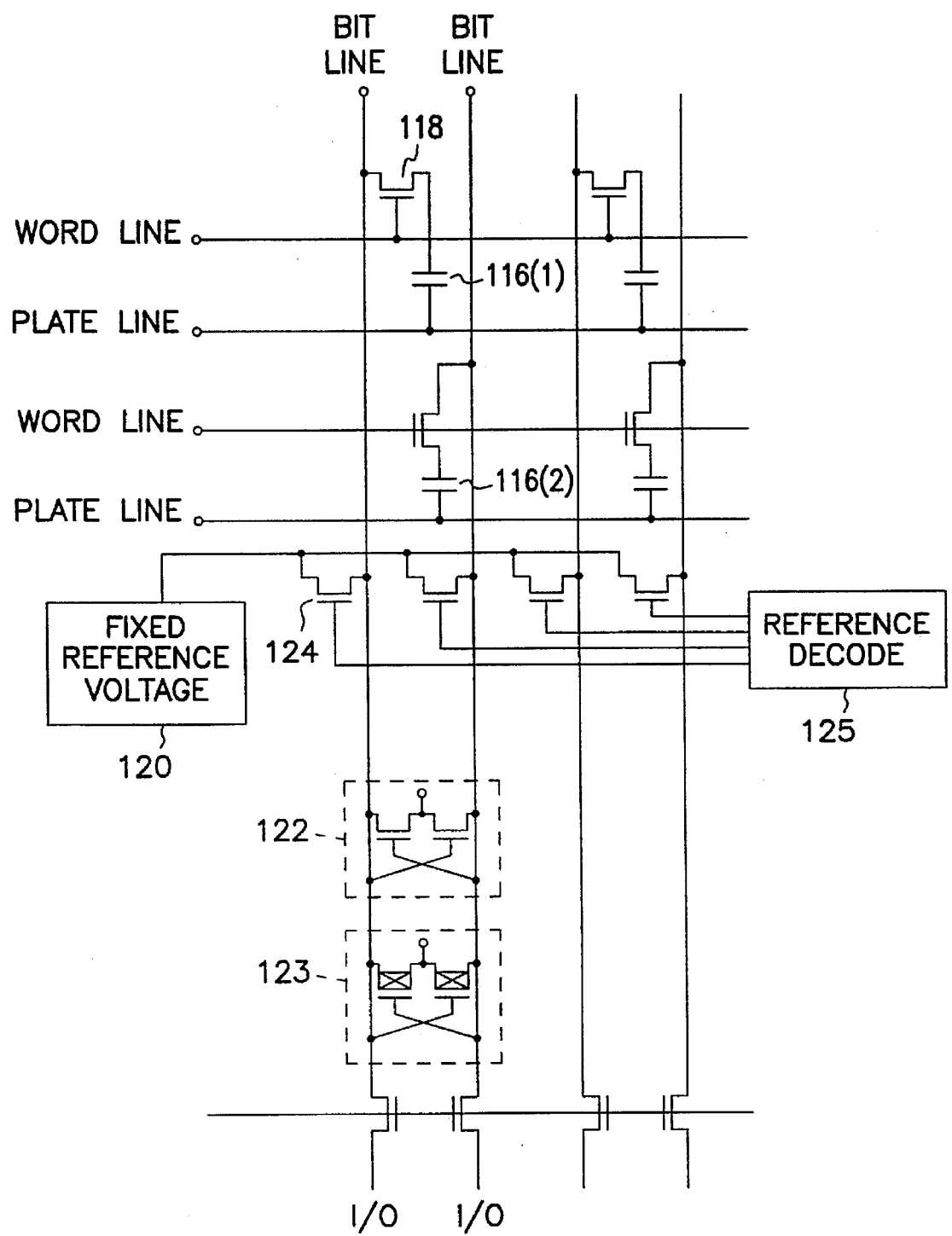
FIG. 6 is a portion of a ferroelectric memory array having a folded bit line architecture and single-ended reference circuit of FIG. 5.

FIG. 6 illustrates the basic concept of a portion of a ferroelectric memory array shown in FIG. 4, a detailed description of array 102 is provided below with reference to FIGS. 9 and 10. Two communication lines, Bit line 1 and Bit line 2, couple ferroelectric memory cell capacitors 116 to the data I/O lines which are connected to input and output buffers. The memory cells have one plate connected to a plate line and the other plate connected to an n-channel MOS access transistor 118. The gate of the access transistor is connected to a word line. The word lines and access transistors are arranged so that one word line couples a memory cell 116(1) to Bit line 1, and the next word line couples a memory cell 116(2) to the Bit line 2.

To access a memory cell, the external address lines 113 are decoded to identify which row of the memory array is to be accessed. The corresponding word line is then raised to a high voltage level so that all of the access transistor having their gate connected to that word line are activated. All of the memory cells associated with that word line, therefore, are coupled to one of the bit lines. If the memory cell were a standard DRAM capacitor, the charge stored on the memory cell capacitors would be shared with the bit lines when the access transistor 118 is activated. Likewise, a ferroelectric memory cell having some non-remnant charge stored thereon will produce a small change to the bit line voltage. If the non-remnant component of the ferroelectric memory cell has been discharged, the bit line voltage will not change. To access the data stored in the memory cell, the plate line associated with the addressed row is pulsed high. As known to one skilled in the art, if the polarization of the ferroelectric dielectric is in one state and the plate line is pulsed high, the current through the memory cell 116 will increase the voltage on the bit line which is coupled thereto. If the polarization of the memory cell is in the opposite state, current through the memory cell is resisted and the voltage of the coupled bit line does not change.

The change in the voltage on the bit line can be sensed using a sense amplifier circuit and a reference circuit 120 which produces a reference voltage. The sense amplifiers are typically comprised of both an n-sense 122 and a p-sense 123 amplifier and detect the difference in the voltage on the bit line and the reference circuit voltage coupled to the other bit line via coupling transistor 124, as known to one skilled in the art. The sense amplifiers drive the bit line pairs to the appropriate voltage rail. That is, if the voltage of the bit line is higher than the reference circuit voltage, the bit line is driven to the positive voltage rail. Conversely, if the bit line is lower than the reference circuit, the bit line is driven to ground. It will be recognized that different sense amplifier and reference circuits can be used without departing from the spirit of the present invention. A reference decode circuit 125 is provided to selectively connect the reference voltage to the unused bit line. By reading the memory cell, the state of the polarization may be reversed and thus the data which was stored on the cell will be revered. That is, in the preferred embodiment the polarization of the dielectric is such that a logical "one" provides a change in voltage of the digit line. To provide the requisite voltage change on the bit line, the polarization of the dielectric is changed. To read a logical one, therefore, the polarization of the memory cell is changed by reading the cell and will represent a logical "zero" after the cell has been read. If, on the other hand, the memory cell was storing a zero, there will be no voltage change on the bit line and the memory cell will remain polarized in a zero state. It can be seen that by merely reading a memory cell the data will be lost if the memory cell was storing a one. A write-back operation must be performed on the memory cell so that the polarization of the memory cell is returned to its pre-read state.

To write a one to the memory cell 116, the bit line coupled to the memory cell must be raised to the positive voltage rail while the plate line is at a low potential. This reverses the polarization of the ferroelectric dielectric which resulted from pulsing the plate line high. The sense amplifiers 122 and 123 are used to write-back a logical one to a memory cell from which a one was read. All of the sense amplifiers associated with a row of memory cells in the memory array are strobed at once. If the column address, therefore., is changed during the read operation, the data stored in any one of the memory cells of a row will not be lost. If, however, the row address is changed during the read operation prior to the sense amplifiers driving the active bit line to a full positive voltage rail, the access transistor 118 connected to the addressed memory cell will be turned off and the data cannot be re-written to the memory cell.

Figure 7:
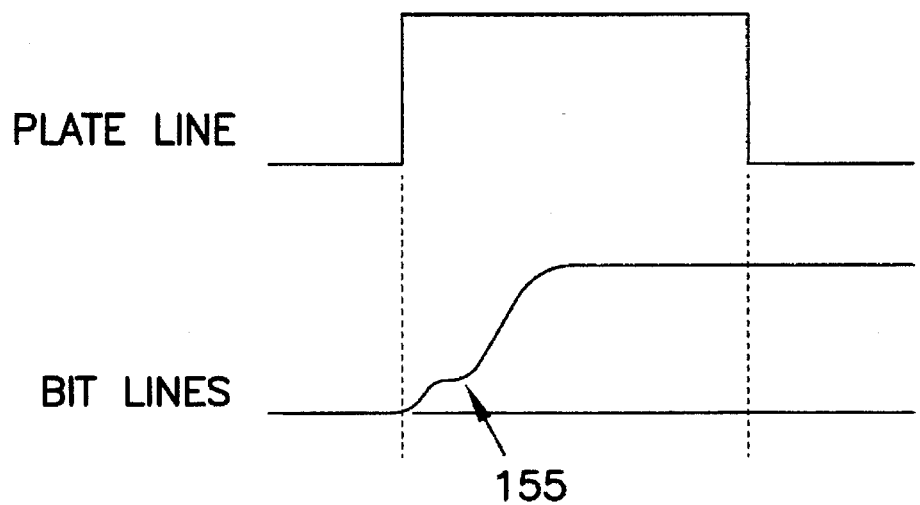
FIG. 7 is a timing diagram of a clocked plate method of accessing a ferroelectric memory cell.
Figure 8:
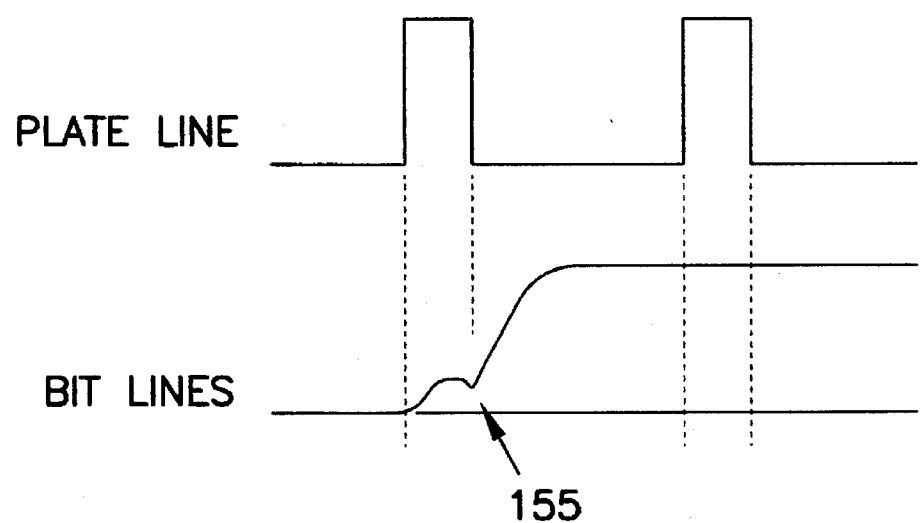
FIG. 8 is a timing diagram of a pulsed plate method of accessing a ferroelectric memory cell.

It will be helpful to fully understand the effect of the voltage placed on the memory cell capacitor plates. FIGS. 7 and 8 illustrate two alternate ways of reading a ferroelectric memory and restoring the data read therefrom. The first method is referred to herein as a clocked plate line, as illustrated in FIG. 7. To access a memory cell, a word line is selectively raised. The plate line of the memory cell is then raised and the data stored on the cell is coupled to the bit line as described above. If the memory cell was storing a 1, the memory cell was rewritten to a 0 merely by reading the cell. The sense amplifiers are then fired, at reference number 155, so that the bit lines are driven to full voltage rails. Because the plate line is high when the bit lines are driven to rail, a 1 is not restored on the memory cell. A 1 will be restored when the plate line goes low while the bit line is high. It will be understood that the bit line potentials can be reversed to change the data on the memory cell and that a 0 will be written to the cell when the bit line is low while the plate line is high.

The second method of reading and restoring a memory cell is referred to as a pulsed plate line and illustrated in FIG. 8. To read the cell, the plate line is pulsed high twice while the cell is coupled to a bit line. The data stored on the memory cell will be reflected on the bit line after the first pulse and the bit line pair is then driven to voltage rails, at reference number 155. If the bit line coupled to the memory cell goes high while the plate line is low, the memory cell will be written to a 1. If the potential on the bit lines are reversed to change the data on the memory cell, a 0 cannot be written to the cell until the plate line is pulsed high again. The plate line is therefore pulsed high a second time to insure that the memory cell stores the proper data.

Because the polarization of the ferroelectric memory cell is determined by the potential of both of the cell's plates at any given time. That is, a 1 is stored anytime the bit line is high while the plate line is low, and a 0 is written anytime the plate line is high while the bit line is low. If both plates are at the same potential, the data stored on the cell is not changed. It can be appreciated that the clocked plate line method is an efficient way of reading from and writing new data to a memory cell, and that the pulsed plate line method is an efficient way of reading and restoring data from a memory cell. Both methods are interchangeable, but the pulsed method is used herein to detail the present invention.

Reference Voltage Circuit

Figure 9:
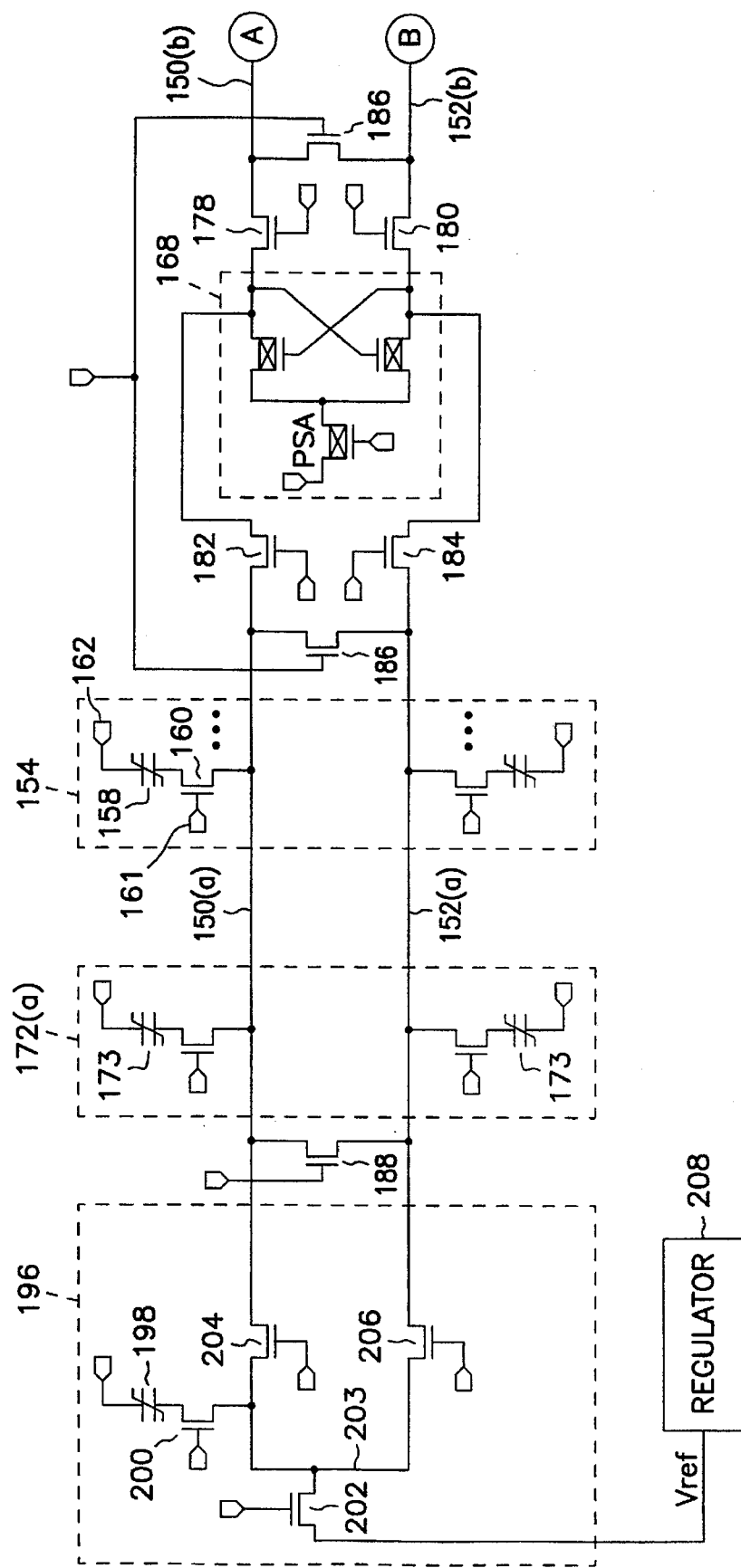
FIGS. 9 and 10 are schematic diagrams of a pair of bit lines and associated circuitry of the memory of FIG. 5.
Figure 10:
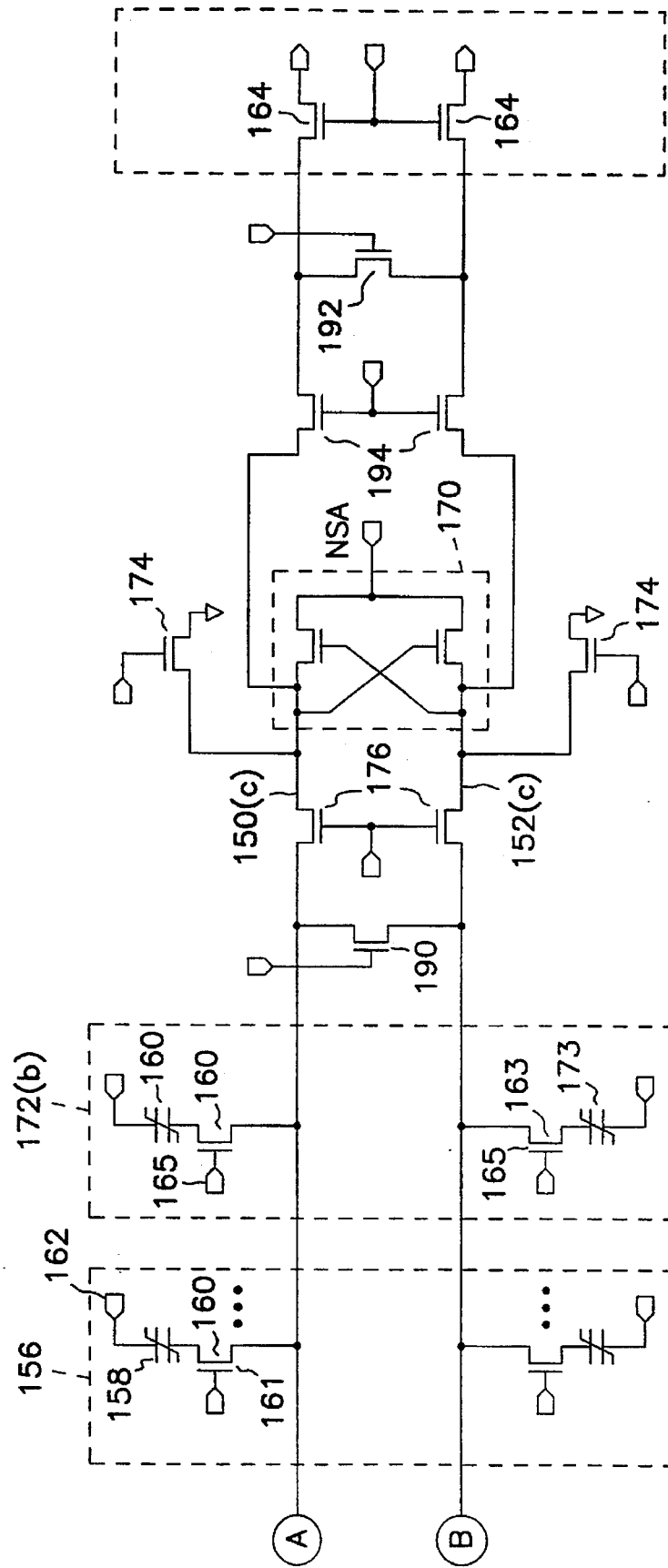

Referring to FIGS. 9 and 10 a portion of the memory array 102 of the memory circuit of the present invention shown in FIG. 5 is described in detail. As stated above, the memory array is arranged in addressable rows and columns, and a memory cell is located at the intersection of each row and column. One memory cell can therefore be accessed by selecting both a row and a column. The memory array is, conceptually, arranged as a plurality of memory cell planes having common rows. This arrangement allows one memory cell in each plane to be accessed by selecting one row and addressing a column in each plane. For example, by using eight planes of memory cells, one byte of data can be stored to, or retrieved from, the array by addressing one row and one column of the array. Each memory array plane, therefore, has a separate input/output connection.

In the present invention, each column of a plane of memory is arranged as a pair of folded bit lines 150 and 152. The bit lines can be electrically separated into sections using isolation transistors, and are represented in FIGS. 9 and 10 by three sections (a), (b), and (c) Each column contains 1024 addressable memory cells with each one capable of storing one bit of data. These memory cells are arranged in two 512-bit sub-arrays 154 and 156. Each sub-array therefore has 512 memory cells which can be coupled to the bit lines. The memory cells are each comprised of a single ferroelectric capacitor 158 which has one plate connected to a plate line 162 and a second plate connected to a n-channel access transistor 160. The gates 161 of the access transistors are connected to word lines. Each word line is associated with a row of the memory array such that by addressing one row of the array, one word line is raised to activate one access transistor in each column. Bit lines 150 and 152 each have an I/O transistor 164 which are used to select the column of the memory array to access via the data input/output lines.

The bit lines are connected to a p-sense amplifier 168, as known to one skilled in the art, located between the sub-arrays 154 and 156. The p-sense amplifier is used to sense a differential voltage between the bit lines and drive the bit line with the higher voltage to a full power supply positive rail. An n-sense amplifier 170 located between sub-array 156 and the I/O transistors 164 is also connected to both bit lines. The n-channel sense amplifier, as known to one skilled in the art, is used to sense a differential voltage between the bit lines and drive the bit line with the lower voltage to the full negative voltage rail, typically ground.

In general, to read data from a memory cell, the bit lines are equilibrated to a predetermined level. The memory cell is then coupled to one of the bit lines by activating the gate of its access transistor. Once the memory cell is coupled to a bit line, the plate line is pulsed high such that a voltage is imparted on the bit line if the memory cell was storing one data logic state, for example a 1. If the memory cell was storing a 0, the voltage on the digit line would remain at the equilibrated level. As explained below, the voltage generated by reading a logic 1 is small and must be amplified before coupling the bit lines to the I/O lines. To amplify the bit line coupled to the selected memory cell, a reference voltage is coupled to the other bit line prior to activating the p-sense amplifier and the n-sense amplifier. The reference voltage is a voltage between the equilibrate level and the voltage created by reading a logic 1. Two different reference circuits and methods are described herein for producing the reference voltage.

The first reference circuit is comprised of two pairs of ferroelectric memory cells 172(a) and (b). Each pair is located beside one of the sub-arrays and on opposite sides of the p-sense amplifier 168. Each of the ferroelectric capacitors 173 of a reference cell pair stores a different logic state. That is, one of the capacitors stores a logic 1, while the other capacitor stores a logic 0. By coupling the bit lines together after they have been coupled to the capacitors, a reference voltage can be generated which has a voltage level that is half the level of a logic 1 voltage.

Some of the other circuitry illustrated includes equilibrate transistors 186, 188, 190, and 192. Isolation transistors 176 and 194 are used to couple the n-sense amplifier to either the bit lines 150 and 152, or transistors 164. Isolation transistors 178, 180, 182, and 184 are provided to selectively couple two of the bit lines 150(a), 150(b), 152(a), or 152(b) to the p-sense amplifier. Transistors 74 are used to couple the n-sense amplifier to ground and transistor 192 is used to equilibrate the n-sense amplifier.

Figure 11:
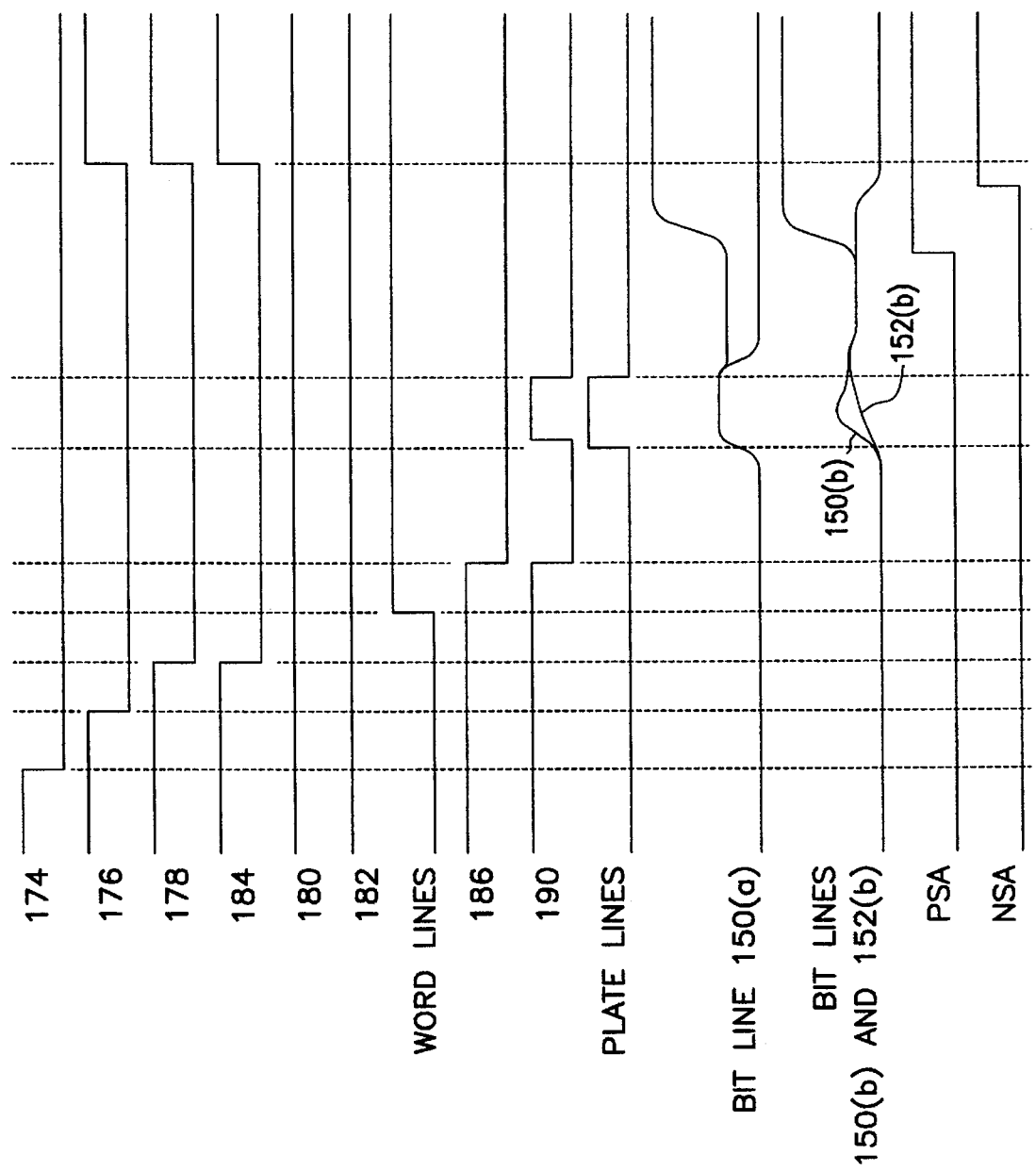
FIG. 11 is a timing diagram illustrating the operation of the reference cell circuit of the schematic of FIGS. 9 and 10.

To fully understand how the reference circuit is used to read a memory cell, reference is made to the timing diagram of FIG. 11. To read data stored in a memory cell which is to be coupled to bit line 150(a), the bit lines must be equilibrated to a low voltage level. N-channel transistors 174 are, therefore, activated so that bit lines 150 and 152 are pulled low. By activating isolation transistors 176, 178, 180, 182 and 184 while the transistor:; 174 are activated, all three sections of the bit lines are pulled low. Equilibrate transistors 186 and 190 are activated to insure that both bit lines are at equal voltage levels. Transistors 174 and 176 are then deactivated to decouple the bit lines from ground, and isolate section (c) of the bit lines, respectively. Transistor 178 is turned off to isolate bit line 150(b) from sense amplifier 168. Similarly, transistor 184 is turned off to isolate bit line 152(a) from sense amplifier 168. Isolation transistors 180 and 182 remain activated.

Once the appropriate sections are isolated from the p-sense amplifier 168 a word line can be selectively raised to couple a memory capacitor 158 to bit line 150(a). Although the memory cell described herein is coupled to bit line 150(a), it will be recognized that any of the memory cells can be read by selectively controlling isolation transistors 178, 180, 182 and 184. Equilibrate transistors 186 and 190 are then turned off. As stated above, the voltage on the bit line will not change until the plate line is pulsed. While the memory cell plate line is pulsed, the voltage on the bit line will increase. The bit line will remain high if the capacitor is storing a logic 1. If the capacitor is storing a logic 0, the bit line will return low when the plate line returns low. On the opposite side of the p-sense amplifier, the two reference cell capacitors 173 of reference circuit 172(b) are coupled to bit lines 150(b) and 152(b) via transistors 163. The reference cell plate lines are pulsed at the same time the memory cell plate lines are pulsed. For clarification, the bit lines which are coupled to the reference cell capacitors are referred to herein as reference bit lines. Because the reference cell capacitors are storing opposite logic levels, only one bit line will increase in voltage level.

Activating equilibration transistor 190 while the plate lines are being pulsed couples bit lines 150(b) and 152(b) together and shares the individual line voltages such that a voltage level is created that is between the equilibrate voltage level (ground) and the logic 1 level. It will be appreciated that by using ferroelectric capacitors, the reference voltage accurately tracks the voltage created by the ferroelectric memory cells.

To sense the data stored in the accessed memory cell, the p-sense amplifier is fired so that the bit line, 150(a) or 152(b), with the highest voltage level is pulled to a high voltage level. Isolation transistors 176, 178 and 184 are then activated to couple the bit lines to the n-sense amplifier 170. The n-sense amplifier is then fired to drive the bit line, 150(c) or 152(c), with the lowest voltage level to ground.

As explained above, a memory cell which had a logical 1 stored thereon was re-written to a logical 0 merely by reading the memory cell. The memory cell will be returned to a logical 1, however, when the bit line is driven high while the memory cell plate line is low. The pair of reference circuit capacitors will also be restored to opposite states on the same cycle as the accessed memory cell. It is preferred to pulse the plate lines high a second time after both sense amplifiers have been fired so that the bit lines are at full voltage rails. It will be recognized that the reference cell plate line and the memory cell plate line can be pulsed together. The reference circuit capacitor 173 coupled to the low bit line will be written to a 0 and the capacitor 173 coupled to the high bit line will remain written to a 1. It is also preferred to discharge the memory capacitors 158 and the reference capacitors 173 prior to taming access transistors 160 and 163 off to reduce fatigue caused by non-remnant charges. Because the capacitors can be written to a logical 1 by raising the voltage on the bit line, traditional equilibration techniques cannot be used. That is, coupling the bit lines together will lower one bit line while raising the other. Transistors 174 are therefore used to pull both bit lines to ground to discharge the cells without effecting the data stored thereon.

The above described reference circuit which uses a pair of ferroelectric memory cells to generate the reference voltage can become fatigued with time. The advantage of having a reference voltage generated by ferroelectric capacitors which perform in the same manner as the memory cells is tainted by the possibility that the reference voltage may change over time,. That is, every time a ferroelectric cell is fired, the performance of the material is slightly degraded. Because the reference cells 173 are fired substantially more often than the memory cells 158, there is a possibility that the reference cells will degrade faster and the resultant reference voltage will change over time. To insure that the reference voltage is stable and located between the voltages resulting from the two logic states, a reference circuit is provided which stores a non-remnant charge on a reference capacitor.

The reference charge circuit 196 includes at least one ferroelectric capacitor 198. Although the capacitor is ferroelectric, it is operated as a standard non-remnant capacitor. The capacitor can be selectively coupled to either of the bit lines 150 or 152 by activating either isolation transistor 204 or 206. Transistors 202 and 200 can be activated to couple the capacitor 198 to a reference voltage, Vref, provided by a voltage regulator 208. In theory, a voltage regulator circuit could be used to provide the reference voltage directly, however, changes in the external power supply voltage would effect the regulated voltage level. Changes in the reference voltage could result in the inability to read data stored in a memory cell. This is because the voltage produced by the ferroelectric memory cell is not dependent upon the supply voltage and is therefore not effected by changes in the supply voltage.

The ferroelectric capacitor 198 and the capacitance of line 203 have a substantially lower combined capacitance than the line capacitance of either bit line 150 or 152. It is preferred that the reference capacitance be about 1/10 the size of the bit lines. This capacitance ratio allows the reference capacitor to be charged to Vref and then shared with the bit line capacitance. Thus, charge conservation defined by $C1*V1+C2*V2=C_{FINAL}V_{FINAL}$ where C1 is the bit line capacitance and C2 is the reference capacitance, can be used to determine the final voltage on the bit line after the reference capacitor has been coupled thereto. For example, if the reference capacitor has been charged to 4 volts and the bit line has been equilibrated to 0 volts, the final bit line voltage after capacitor 198 is coupled to the bit line is defined as:

$$V_{FINAL}=C2*4/C_{FINAL},$$

or $$V_{FINAL}=4/10=0.4 \text{ volts}$$

It can be seen that if the reference voltage fluctuates with changes in the supply voltage, the final bit line voltage will only change by 1/10 of the fluctuation. The reference voltage, therefore, is substantially supply voltage independent.

Capacitor 198 can be a plurality of parallel capacitors such that a laser or electronic key, as known to one skilled in the art, can then be used to "trim" the capacitance so that the final reference voltage level on the bit line is between ground and the voltage generated by a memory cell storing a logic 1. Further, the reference capacitor is not limited to ferroelectric capacitors but can be any non-remnant capacitor.

A course adjustment of the reference voltage can be made by adjusting the regulated voltage, while a fine adjustment can be made by changing the number of capacitors 198 coupled to line 203. By changing the regulated voltage cell margin can be measured for the memory circuit. This is accomplished by systematically raising the reference voltage until a memory cell storing a logical 1 is read as a logical 0. That is, when a memory cell is read incorrectly the reference voltage is above the memory cell voltage. The difference between the beginning reference voltage and the voltage at which the memory cell is erroneously read is the cell margin.

Figure 12:
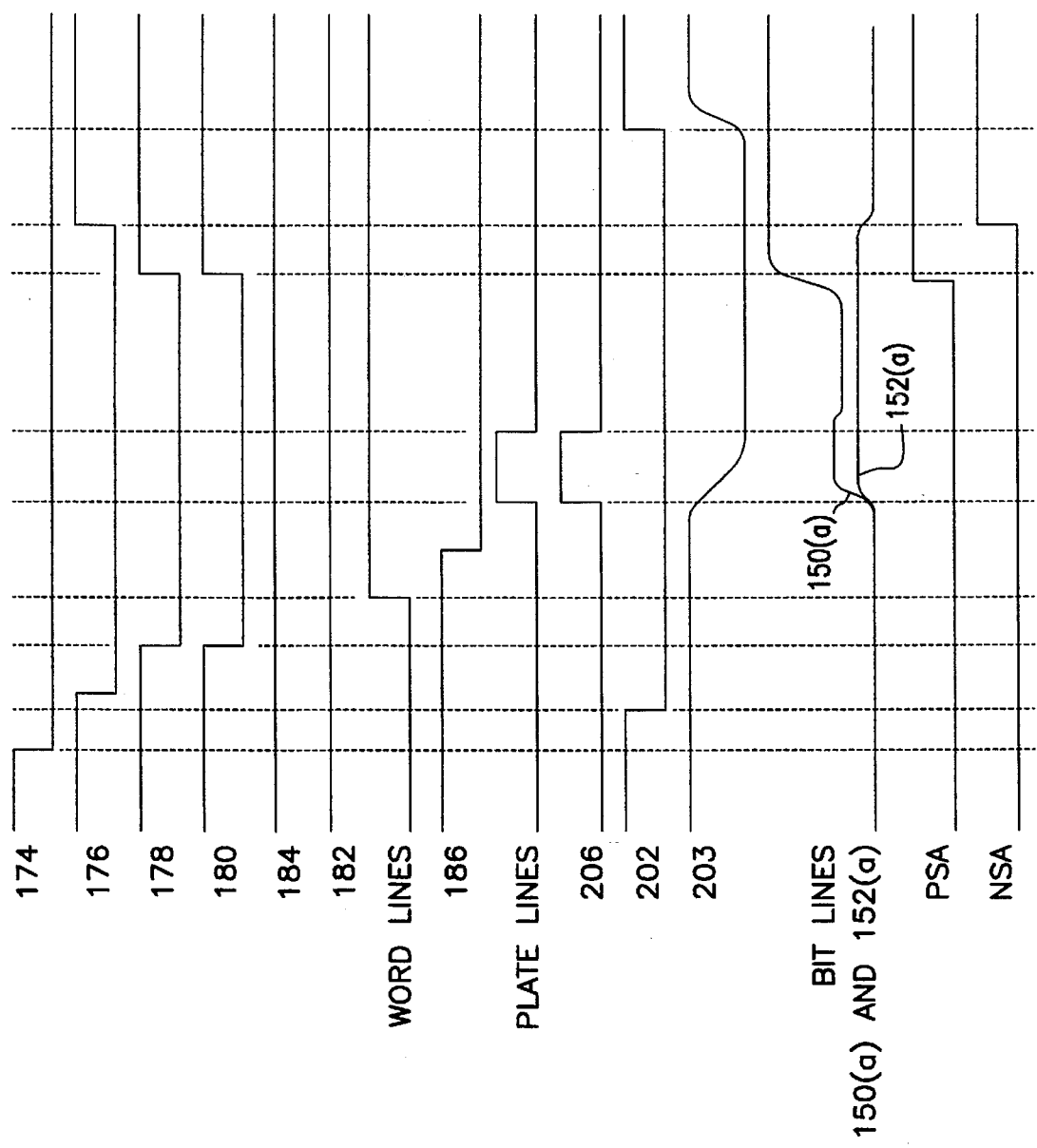
FIG. 12 is a timing diagram illustrating the operation of the reference charge circuit of the schematic of FIGS. 9 and 10.

In operation, a memory cell is read in a similar manner to that described above using the reference cell circuit. Referring to FIG. 12, to read data stored in a memory cell which is to be coupled to bit line 150(a), the bit lines must be equilibrated to a low voltage level. N-channel transistors 174 are, therefore, activated so that bit lines 150 and 152 are pulled low. By activating isolation transistors 176, 178, 180, 182 and 184 while the transistors 174 are activated, all three sections of the bit lines are pulled low. Equilibrate transistors 186 are activated to insure that both bit lines are at equal voltage levels. Transistors 174 and 176 are then deactivated to decouple the bit lines from ground, and isolate section (c) of the bit lines, respectively. Transistor 178 is turned off to isolate bit line 150(b) from sense amplifier 168. Similarly, transistor 180 is turned off to isolate bit line 152(b) from sense amplifier 168. Isolation transistors 182 and 184 remain activated so that section (a) of the bit lines are coupled to the p-sense amplifier.

Equilibrate transistors 204 and 206 are turned off so that node 203 is isolated from section (a) of the bit lines. Transistor 202 has been turned on so that node 203 and any activated capacitors 198 are charged to the voltage level of the regulator circuit 208. Transistor 202 is then turned off and a word line, or gate of transistor 161, can be selectively raised to couple a memory capacitor 158 to bit line 150(a). Although the memory cell described herein is coupled to bit line 150(a), it will be recognized that any of the memory cells can be read by selectively controlling isolation transistors 178, 180, 182 and 184. Equilibrate transistors 186 are then turned off. As stated above, the voltage on the bit line will not change until the plate line is pulsed. The plate line is pulsed high to read a memory cell. The memory cell illustrated in FIG. 12 is storing a logical 1, such that bit line 150(a) maintains a high voltage after the plate line returns low. The gate of transistor 206 is also pulsed high when the plate line is pulsed so that the charge stored on line 203 is shared with bit line 152(a). By charge sharing line 203 with 152(a), the voltage of line 152(a) is raised to a reference level which is 1/10 the level of line 203.

The p-sense amplifier is fired so that the bit line, 150(a), which has the highest level is driven to the full positive voltage rail. Transistors 178 and 180 activated to couple the p-sense amplifier to the n-sense amplifier, and then the n-sense amplifier is then fired so that bit line 152 is driven to ground. After line 203 is charge shared with a bit line, transistor 202 is re-activated to couple the line to the voltage regulator and re-charge both line 203 and capacitors 198.

It will be appreciated that both the reference cell circuit 172 and the reference charge circuit can be included in one memory circuit to provide flexibility and redundancy.

CONCLUSION

A ferroelectric memory circuit has been described which has an array of ferroelectric memory cells fabricated as capacitors. The memory cells can be selectively coupled to a bit line for writing to or reading therefrom. Sense amplifiers have been described for reading the memory cells by sensing a voltage on the bit line resulting from the polarization of the memory cell coupled thereto. A reference voltage is used by the sense amplifiers to determine the state of the data stored on a memory cell. The reference voltage is produced by a pair of ferroelectric reference cells; one cell polarized as a logical 1, and the other polarized as a logical 0. Alternatively, the reference voltage can be produced by a reference circuit using a charge capacitor. A circuit and method have been described for sharing the reference cells to produce the reference voltage having a potential voltage between the bit line potentials which represent the two logical states. A circuit and method have been described for selectively coupling the reference voltage to the sense amplifiers based on the location of the memory cell being read.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, redundant ferroelectric reference cell pairs could be used to produce the reference voltage. Therefore, it is manifestly intended that this invention be limited only by the claims and the equivalents thereof.

What is claimed is:

1. An integrated circuit memory comprising:
   an array of ferroelectric memory cells;
   a sense amplifier to sense and amplify data stored on the ferroelectric memory cells;
   a first pair of bit line sections coupled to the sense amplifier and ferroelectric memory cells;
   a second pair of bit line sections coupled to the sense amplifier and ferroelectric memory cells;
   a first reference circuit coupled to the first pair of bit line sections and having a plurality of ferroelectric reference cells for providing a first reference voltage; and a second reference circuit coupled to the second pair of bit line sections and having a plurality of ferroelectric reference cells for providing a second reference voltage.

2. The integrated circuit memory of claim 1 wherein:

the plurality of ferroelectric reference cells of each of the first and second reference circuits are an even number, and a first one-half of the plurality of ferroelectric reference cells are polarized in one state and a second one-half of the plurality of ferroelectric reference cells are polarized in an opposite state.

3. The integrated circuit memory of claim 2 wherein:

the first one-half of the plurality of ferroelectric reference cells are coupled to a first bit line section;

the second one-half of the plurality of ferroelectric reference cells are coupled to a second bit line section; and the first and second reference circuits include an equilibrate circuit connected to the first bit line section and the second bit line section for electrically coupling the first bit line section to the second bit line section.

4. The integrated circuit memory of claim 3 wherein the equilibrate circuit comprises an n-channel transistor having a source connected to the first reference bit line and a drain connected to the second reference bit line.

5. The integrated circuit memory of claim 3 further including:

isolation circuitry for selectively coupling either the first bit line section or the second bit line section to the sense amplifier.

6. An integrated circuit memory comprising:

a sense amplifier to sense and amplify data stored on ferroelectric memory cells;

a first pair of bit line sections coupled to the sense amplifier and ferroelectric memory cells;

a second pair of bit line sections coupled to the sense amplifier and ferroelectric memory cells;

an array of ferroelectric memory cells coupled to the first and second pair of bit line sections;

first reference circuitry comprising two ferroelectric reference cells, a first one of the ferroelectric reference cells is polarized in one state and a second one of the ferroelectric reference cells is polarized in an opposite state;

a first bit line of the first pair of bit line sections coupled to the first one of the ferroelectric reference cells;

a second bit line of the first pair of bit line sections coupled to the second one of the ferroelectric reference cells;

a first equilibrate circuit connected to the first bit line and the second bit line of the first pair of bit line sections for electrically coupling the first bit line to the second bit line; and first isolation circuitry for selectively coupling either the first bit line or the second bit line of the first pair of bit line sections to the sense amplifier;

second reference circuitry comprising two ferroelectric reference cells, a first one of the ferroelectric reference cells is polarized in one state and a second one of the ferroelectric reference cells is polarized in an opposite state;

a first bit line of the second pair of bit line sections coupled to the first one of the ferroelectric reference cells;

a second bit line of the second pair of bit line sections coupled to the second one of the ferroelectric reference cells;

a second equilibrate circuit connected to the first bit line and the second bit line of the second pair of bit line sections for electrically coupling the first bit line to the second bit line; and second isolation circuitry for selectively coupling either the first bit line or the second bit line of the second pair of bit line sections to the sense amplifier.

7. The integrated circuit memory of claim 6 wherein the first and second equilibrate circuits each comprise an n-channel transistor having a source connected to the first bit line and a drain connected to the second bit line.

8. The integrated circuit memory of claim 6 wherein the first and second isolation circuitry each comprise:

a first n-channel transistor having a source connected to the first bit line and a drain connected to the sense amplifier; and a second n-channel transistor having a source connected to the second bit line and a drain connected to the sense amplifier.

9. A method of providing a reference voltage in a ferroelectric memory device comprising a first pair of bit line sections coupled to a sense amplifier, a second pair of bit line sections coupled to the sense amplifier, a first reference circuit having a plurality of ferroelectric reference cells coupled to the first pair of bit line sections, and a second reference circuit having a plurality of ferroelectric reference cells coupled to the second pair of bit line sections, the method comprising the steps of:

selecting a memory cell associated with a bit line of the first pair of bit line sections;

reading the memory cell;

coupling the bit line of the first pair of bit line sections to a first sensing node of the sense amplifier;

activating the second reference circuit to produce a reference voltage; and coupling the second reference circuit to a second sensing node of the sense amplifier.

10. The method of claim 9 wherein the step of activating the second reference circuit to produce a reference voltage comprises the steps of:

coupling a first ferroelectric reference cell to a first bit line of the second pair of bit line sections, the first ferroelectric reference cell storing a first logic state;

coupling a second ferroelectric reference cell to a second bit line of the second pair of bit line sections, the second ferroelectric reference cell storing a second logic state;

reading the first and second ferroelectric reference cells; and electrically coupling the first and second bit lines together.

11. The method of claim 10 further including the steps of:

restoring the first ferroelectric reference cell to a first logic state; and restoring the second ferroelectric reference cell to a second logic state.

12. The method of claim 10 further including the steps of:

restoring the memory cell on a first clock cycle; and restoring the first and second reference cells on the first clock cycle.

* * * * *

UNITED STATES PATENT AND TRADEMARK OFFICE
CERTIFICATE OF CORRECTION

PATENT NO. : 5,638,318
DATED : June 10, 1997
INVENTOR(S) : Mirmajid Seyyedy

It is certified that error appears in the above-identified patent and that said Letters Patent is hereby corrected as shown below:

At Column 3, line 18, please delete "from one, row" and insert --from one row--.

At Column 3, line 45, please delete "traderstanding" and insert --understanding--.

At Column 5, line 28, please delete "font," and insert --form--.

At Column 9, line 15, please delete "74" and insert --174--.

At Column 9, line 25, please delete "transistor:;" and insert --transistors--.

At Column 10, line 21, please delete "taming" and insert --turning--.

At Column 14, line 1, claim 6, please delete "bit line, sections" and insert --bit line sections--.

Signed and Sealed this

Tenth Day of February, 1998

*Attest:*

BRUCE LEHMAN

*Attesting Officer*  Commissioner of Patents and Trademarks

UNITED STATES PATENT AND TRADEMARK OFFICE
CERTIFICATE OF CORRECTION

| | |
|---|---|
| PATENT NO. | : 5,638,318 |
| DATED | : June 10, 1997 |
| INVENTOR(S) | : Mirmajid Seyyedy |

It is certified that error appears in the above-identified patent and that said Letters Patent is hereby corrected as shown below:

Column 1 after the Title, insert
-- GOVERNMENT RIGHTS
      This invention was made with United States Government support under contract No. MDA972-94-C-0006 awarded by the Advanced Research Projects Agency (ARPA). The United States Government has certain rights in this invention. --.

Signed and Sealed this

Twenty-fifth Day of September, 2001

Attest:

*Attesting Officer*

NICHOLAS P. GODICI
*Acting Director of the United States Patent and Trademark Office*